(12) United States Patent
Yu

(10) Patent No.: US 6,248,637 B1
(45) Date of Patent: Jun. 19, 2001

(54) PROCESS FOR MANUFACTURING MOS TRANSISTORS HAVING ELEVATED SOURCE AND DRAIN REGIONS

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/405,831

(22) Filed: Sep. 24, 1999

(51) Int. Cl.[7] .................. H01L 21/336; H01L 21/425; H01L 21/22; H01L 21/38
(52) U.S. Cl. .................. 438/300; 438/305; 438/306; 438/527; 438/546
(58) Field of Search .................. 438/300, 305, 438/306, 527, 546

(56) References Cited

U.S. PATENT DOCUMENTS

| 4,745,082 | 5/1988 | Kwok . |
| 4,784,718 | 11/1988 | Mitani et al. . |
| 5,200,352 | * 4/1993 | Pfiester . |
| 5,264,382 | 11/1993 | Watanabe . |
| 5,320,974 | * 6/1994 | Hori et al. . |
| 5,374,575 | 12/1994 | Kim et al. . |
| 5,391,510 | 2/1995 | Hsu et al. . |
| 5,429,956 | 7/1995 | Shell et al. . |
| 5,675,159 | 10/1997 | Oku et al. . |
| 5,716,861 | 2/1998 | Moslehi . |
| 5,733,792 | * 3/1998 | Masuoka . |
| 5,856,225 | 1/1999 | Lee et al. . |
| 5,858,843 | 1/1999 | Doyle et al. . |
| 6,090,691 | * 7/2000 | Ang et al. . |
| 6,124,176 | * 9/2000 | Togo . |

FOREIGN PATENT DOCUMENTS

| 3-248433 | 11/1991 | (JP) . |
| 4-123439 | 4/1992 | (JP) . |
| 5-160396 | 6/1993 | (JP) . |

OTHER PUBLICATIONS

"Sub 50–nm Fin FET: PMOS" Huang, et al. 1999 IEEE.
"Ultra–Thin–Body Silicon–On–Insulator MOSFET's for Terabit–Scale Integration" Yu, et al.
International Electronics Meeting Dec. 7, 1997
"Sub–100nm Gate Length Metal Gate NMOS Transistors Fabricated by a Replacement Gate Process" Chatterjee, et al. 1997 IEEE.

* cited by examiner

Primary Examiner—John F. Niebling
Assistant Examiner—Ron Pompey
(74) Attorney, Agent, or Firm—Foley & Lardner

(57) ABSTRACT

An ultra-large-scale integrated (ULSI) circuit includes MOSFETs on a substrate. The MOSFETs include elevated source and drain regions. The elevated source and drain regions are adjacent ultra-shallow source and drain regions. Dopants in the ultra-shallow source and drain regions are activated in a low-temperature rapid thermal anneal process.

20 Claims, 2 Drawing Sheets

PROCESS FOR MANUFACTURING MOS TRANSISTORS HAVING ELEVATED SOURCE AND DRAIN REGIONS

CROSS REFERENCE TO RELATED APPLICATIONS

This patent application is related to U.S. application Ser. No. 09/255,546, filed on Feb. 22, 1999, by Yu entitled "Locally Confined Deep Pocket Process for ULSI MOSFETS", U.S. application Ser. No. 09/397,217 filed on Sep. 16, 1999, by Yu, et al. entitled "Source/Drain Doping Technique for Ultra-Thin-Body SOI MOS Transistors", and U.S. application Ser. No. 09/384,121 filed on Aug. 27, 1999, by Yu entitled "CMOS Transistors Fabricated in Optimized RTA Scheme", all assigned to the assignee of the present invention.

BACKGROUND OF THE INVENTION

The present invention relates to integrated circuits (ICs) and methods of manufacturing integrated circuits. More particularly, the present invention relates to a method of manufacturing integrated circuits having transistors with elevated source and drain regions.

Currently, deep-submicron complementary metal oxide semiconductor (CMOS) is the primary technology for ultra-large scale integrated (ULSI) devices. Over the last two decades, reducing the size of CMOS transistors and increasing transistor density on ICs has been a principal focus of the microelectronics industry. An ultra-large scale integrated circuit can include over 1 million transistors.

The ULSI circuit can include CMOS field effect transistors (FETS) which have semiconductor gates disposed between drain and source regions. The drain and source regions are typically heavily doped with a P-type dopant (boron) or an N-type dopant (phosphorous).

The drain and source regions generally include a thin extension that is disposed partially underneath the gate to enhance the transistor performance. Shallow source and drain extensions help to achieve immunity to short-channel effects which degrade transistor performance for both N-channel and P-channel transistors. Short-channel effects can cause threshold voltage roll-off and drain-induced barrier-lowering. Shallow source and drain extensions and, hence, controlling short-channel effects, are particularly important as transistors become smaller.

Conventional techniques utilize a double implant process to form shallow source and drain extensions. According to the conventional process, the source and drain extensions are formed by providing a transistor gate structure without sidewall spacers on a top surface of a silicon substrate. The silicon substrate is doped on both sides of the gate structure via a conventional doping process, such as, a diffusion process or an ion implantation process. Without the sidewall spacers, the doping process introduces dopants into a thin region just below the top surface of the substrate to form the drain and source extensions as well as to partially form the drain and source regions.

After the drain and source extensions are formed, silicon dioxide spacers, which abut lateral sides of the gate structure, are provided over the source and drain extensions. With the silicon dioxide spacers in place, the substrate is doped a second time to form deep source and drain regions. During formation of the deep source and drain regions, further doping of the source and drain extensions is inhibited due to the blocking capability of the silicon dioxide spacers.

As the size of transistors disposed on ICs decreases, transistors with shallow and ultra-shallow source/drain extensions become more difficult to manufacture. For example, a small transistor may require ultra-shallow source and drain extensions with less than 30 nanometer (nm) junction depth. Forming source and drain extensions with junction depths of less than 30 nm is very difficult using conventional fabrication techniques. Conventional ion implantation techniques have difficulty maintaining shallow source and drain extensions because point defects generated in the bulk semiconductor substrate during ion implantation can cause the dopant to more easily diffuse (transient enhanced diffusion, TED). The diffusion often extends the source and drain extension vertically into the bulk semiconductor substrate. Also, conventional ion implantation and diffusion-doping techniques make transistors on the IC susceptible to short-channel effects, which result in a dopant profile tail distribution that extends deep into the substrate.

The source region and drain regions can be raised by selective silicon (Si) epitaxy to make connections to source and drain contacts less difficult. The raised source and drain region provide additional material for contact silicidation processes. However, the raised source and drain region do not necessarily make conventional doping processing for source and drain junctions less challenging, especially with respect to transistors with small gate lengths. The spacing between the source and drain regions in devices with gate lengths below 70 nm is extremely narrow (e.g., only 25–30 nm).

According to conventional doping techniques, the dopant implanted into the source and drain region must be activated at temperatures of 900–1100° C. for several seconds. The high temperatures, often referred to as high thermal budget, associated with conventional doping techniques can produce significant thermal diffusion which can cause shorts between the source and drain region (between the source/drain extensions). The potential for shorting between the source and drain region increases as gate lengths decrease.

According to conventional processes (e.g., self-aligned CMOS fabrication processes), the polysilicon gate, source and drain regions are implanted (doped) during the same fabrication step. After doping the gate, source and drain regions, the substrate is subject to a heating process which activates the dopant in the gate, source and drain regions. However, electrical activation of dopants in the gate, deep source region and deep drain region requires a temperature, typically greater than 1050 degrees C., which is higher than temperatures required to activate dopants in the source and drain extensions. The higher temperature increases the active dopant concentration in the gate which gives the transistor more drive current due to reduced gate-depletion effect. In addition, the higher temperature reduces silicide-to-junction resistance by increasing active dopant concentration in the deep source and deep drain regions.

As described above, higher temperatures increase the susceptibility of the transistor to short channel effects. To reduce the potential for short channel effects, formation of ultra-shallow source and drain extensions and tight halo profiles require low rapid thermal anneal (RTA) temperatures (e.g., less than 900 degrees C. in crystalline silicon or less than 800 degrees C. in preamorphized silicon). Therefore, optimizing the heating step for the gate, deep source and drain regions as well as for the drain and source extensions is difficult.

Thus, there is a need for an integrated circuit or electronic device that includes transistors not susceptible to shorts caused by dopant thermal diffusion. Further still, there is a need for transistors with elevated source and drain regions manufactured in an optimized annealing process. Even further still, there is a need for source and drain regions having dopants activated in a low thermal budget (low temperature) process.

SUMMARY OF THE INVENTION

An exemplary embodiment relates to a method of manufacturing an integrated circuit. The method includes providing a gate structure between a source location and a drain location in a semiconductor substrate. The gate structure includes a side wall. The method further includes oxidizing the side wall to form an oxide structure, selectively providing a semiconductor material above the source location and the drain location, doping the source location and the drain location to form elevated source and drain regions, removing the oxide structure to create an opening, and providing a dopant through the opening. The dopant forms a source or a drain extension.

Another embodiment is related to a method of manufacturing an ultra-large scale integrated circuit including a transistor. The method includes steps of: forming at least part of a gate structure on a top surface of a semiconductor substrate, depositing a semiconductor material over the top surface of the semiconductor substrate, providing a dopant to the semiconductor substrate and the semiconductor material to form elevated source and drain regions, removing a sacrificial material on side walls of the gate structure to leave a pair of openings, and providing a dopant through the pair of openings. The dopant forms shallow source and drain extensions.

Yet another embodiment relates to a process for forming a transistor with a elevated source region, an elevated drain region, a shallow source extension and a shallow drain extension. The process includes forming a gate structure on a top surface of a substrate, growing a material on side walls of the gate conductor, providing a semiconductor material on the top surface of the substrate, removing the material from the side walls to leave openings, and providing a dopant through the opening.

BRIEF DESCRIPTION OF THE DRAWINGS

Exemplary embodiments will hereafter be described with reference to the accompanying drawings, wherein like numerals denote like elements, and.

DETAILED DESCRIPTION OF THE PREFERRED EMBODIMENTS

Figure 1:
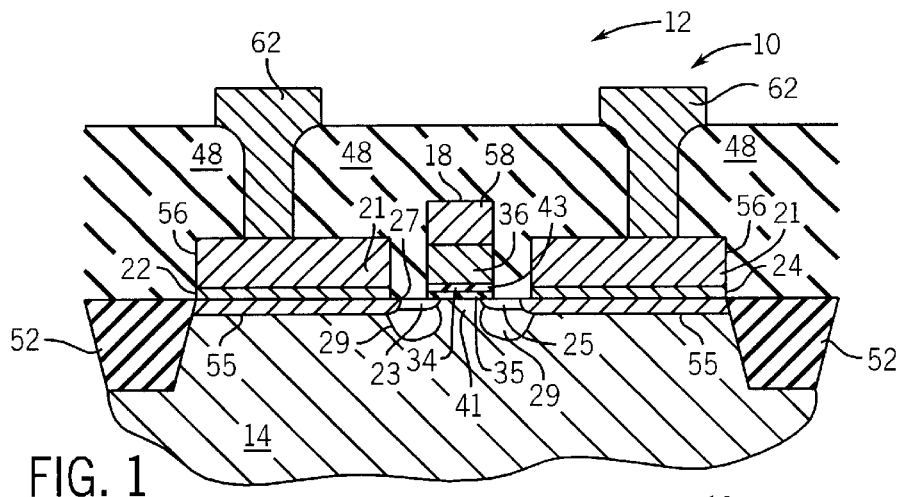
FIG. 1 is a cross-sectional view of a portion of an integrated circuit in accordance with an exemplary embodiment of the present invention, the integrated circuit includes a transistor provided on a semiconductor substrate.

With reference to FIG. 1, a portion 10 of an integrated circuit (IC) includes a transistor 12 which is disposed on a semiconductor substrate 14, such as, a wafer. Semiconductor substrate 14 is preferably a bulk P-type silicon substrate. Alternatively, substrate 14 can be a gallium arsenide (GaAs), germanium, or a semiconductor-on-insulator (SOI) substrate.

Transistor 12 can be a P-channel or N-channel metal oxide semiconductor field effect transistor (MOSFET) and is described below as an N-channel transistor. Transistor 12 includes a gate structure 18, an elevated source region 22, and an elevated drain region 24. Regions 22 and 24 extend from a top surface 21 (above a top surface 27 of substrate 14) to a bottom 55 in substrate 14. Regions 22 and 24 are 10 nm thick (from surface 21 to bottom 55) and include a source extension 23 and a drain extension 25. For an n-channel transistor, regions 22 and 24 are heavily doped with n-type dopants (e.g., $5 \times 10^{19}$–$1 \times 10^{20}$ dopants per cubic centimeter).

Extensions 23 and 25 are preferably ultra-shallow extensions (e.g., junction depth is less than 20 nanometers (nm)), which are thinner than regions 22 and 24. Extensions 23 and 25 are connected to regions 22 and 24, respectively, and are disposed partially underneath gate structure 18. Ultra-shallow extensions 23 and 25 help transistor 12 achieve substantial immunity to short-channel effects. Short-channel effects can degrade performance of transistor 12 as well as the manufacturability of the IC associated with transistor 12. Regions 22 and 24 and extensions 23 and 25 have a concentration of $10^{19}$ to $10^{20}$ dopants per cubic centimeter. An appropriate dopant for a P-channel transistor is boron, boron diflouride, or iridium, and an appropriate dopant for a N-type transistor is arsenic, phosphorous, or antimony.

Gate stack or structure 18 includes a gate dielectric composite layer 34 and a gate conductor 36. Composite layer 34 is preferably comprised of thermally grown, 100 Å thick silicon dioxide layer 35 and a 200 Å thick nitride ($Si_3N_4$) layer 43. An insulative layer 48 can cover structure 18 and serve as spacers for transistor 12.

Conductor 36 is preferably deposited by chemical vapor deposition (CVD) and etched to form the particular structure for transistor 12. Conductor 36 is preferably polysilicon. Gate structure 18 has a height or thickness of 800–1200 Å.

Gate structure 18 is disposed over a channel region 41. Pocket implant regions 29 are situated below extensions 23 and 25. Regions 29 are preferably doped opposite to the conductive type of extensions 23 and 25 at a concentration of $10^{18}$ dopants per cubic centimeter. Regions 29 are located 80 nm below a top surface 38 of substrate 14. Regions 29 are provided below extensions 23 and 25 to prevent source/drain punch-through in depletion regions. In addition, regions 29 are provided to achieve additional immunity to short-channel effects. Preferably, regions 29 are implanted by an ion implantation technique and include opposite dopants to the dopants utilized in regions 22 and 24. Accordingly, an appropriate dopant for pocket regions 29 of an N-channel transistor is boron, boron diflouride, or iridium, and an appropriate dopant for pocket 29 regions of a P-type transistor is arsenic, phosphorous, or antimony.

A silicide layer 56 is deposited or sputtered on top of source region 22 and drain region 24. Preferably, layer 56 is tungsten silicide ($WSi_x$). Alternatively, layer 56 can be any type of a refractory metal and silicon combination, such as, a cobalt silicide, nickel silicide, or other silicide material. A layer 58, similar to layer 56, is disposed above gate conductor 36. Metal contacts 62 are coupled to layer 56 through insulating layer 48.

Transistor 12 is disposed between isolation regions 52 in substrate 14. Isolation regions 52 are preferably oxide structures which separate transistor 12 from neighboring transistors. Regions 52 can be formed in a local oxidation of silicon (LOCOS) process, a shallow trench isolation (STI) process, or other insulative structure formation process.

Transistor 12 can be an N-channel or a P-channel field effect transistor, such as, a metal oxide semiconductor field effect transistor (MOSFET). Transistor 12 is at least partially covered by insulative layer 48 and is preferably part of an ultra-large scale integrated (ULSI) circuit that includes one million or more transistors.

With reference to FIGS. 1–8, the fabrication of transistor 12, including elevated source region 22 and elevated drain region 24, is described below as follows. The advantageous process allows source and drain extensions 23 and 25, respectively, to be annealed in a low thermal budget process while annealing source and drain regions 22 and 24 and gate conductor 36 in a high thermal budget process. The low thermal budget reduces the lateral spread of dopants into channel 41 and thereby reduces susceptibility to short circuits between extension 23 and 25.

Figure 2:
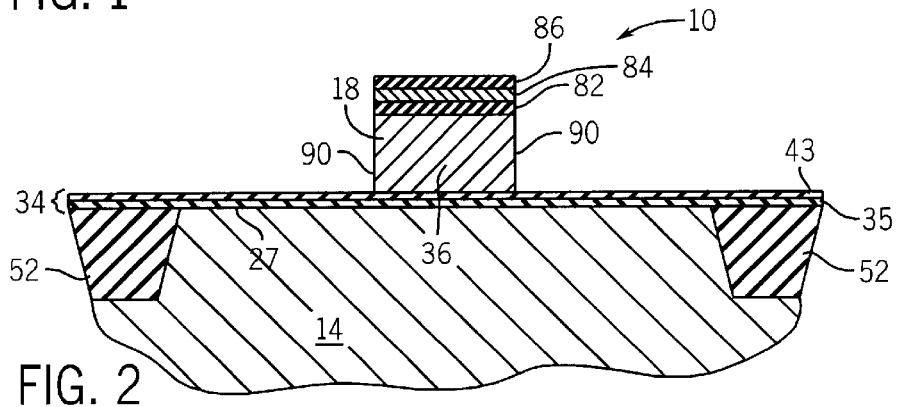
FIG. 2 is a cross-sectional view of the portion of the substrate illustrated in FIG. 1, showing a gate stack formation step.

In FIG. 2, transistor 12 can be substantially formed by conventional semiconductor processing techniques to include gate structure 18. Substrate 14 includes insulative structures 52.

Gate structure 18 is comprised of layer 35 (an interfacial oxide layer), layer 43 (a nitride gate insulator), and gate conductor 36. Gate conductor 36 preferably is 800–1200 Å thick, undoped polysilicon material. Conductor 36 is preferably deposited by a chemical vapor deposition (CVD) process on top of layer 43 which is deposited by CVD on layer 35. Layer 35 can be thermally grown on substrate 14.

A 200 Å thick nitride layer 82 is provided above conductor 36. A 100 Å thick oxide layer 84 is provided above layer 82 and a 100 Å thick nitride layer 86 is provided above layer 84. Nitride layers 82 and 86 are deposited by CVD. Oxide layer 84 is thermally grown or deposited on top of layer 82. The undoped polysilicon material 36 and layers 82, 84 and 86 can be selectively etched to leave gate structure 18. Preferably, the selective etch is a dry etch. Layers 82, 84 and 86 form a composite cap layer above conductor 18.

Figure 3:
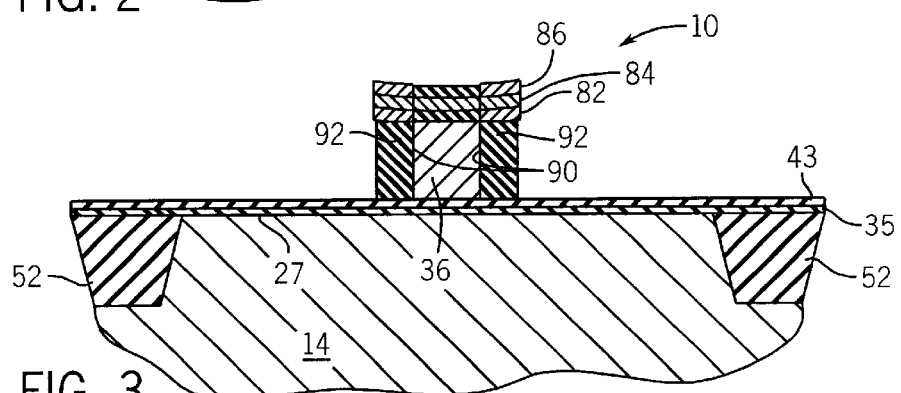
FIG. 3 is a cross-sectional view of the portion of the substrate illustrated in FIG. 2, showing an oxidation step to form an oxidized structure on a side wall of the gate stack.

Layers 43 and 35 are not etched at the location of the source and drain region during the dry etch. Layers 43 and 35 protect source and drain locations (regions 22 and 24 of FIG. 1) from oxidation in subsequent processing steps (FIG. 3). Similarly, layers 82, 84 and 86 protect conductor 36 during subsequent oxidation steps (FIG. 3).

In FIG. 3, portion 10 is subjected to a oxidation process which forms oxide structures 92 on side walls 90 of gate conductor 18. Preferably, oxidized structures are formed by heating portion 10 in an ambient oxygen environment at a temperature between 900–1000° C. Structures 92 are preferably 300–500 Å wide (e.g., left to right) and 1000–2000 Å thick (e.g., top to bottom). In addition, oxidization increases the size of layers 82, 84 and 86 above structures 92. After structures 92 are formed, layers 86 and 84 are removed by a dry etching technique. In addition, the dry etching technique removes layers 43 and 35 from top surface 27 of substrate 14. Alternatively, other growth techniques can be utilized to form sacrificial material, such as, structures 92.

Figure 4:
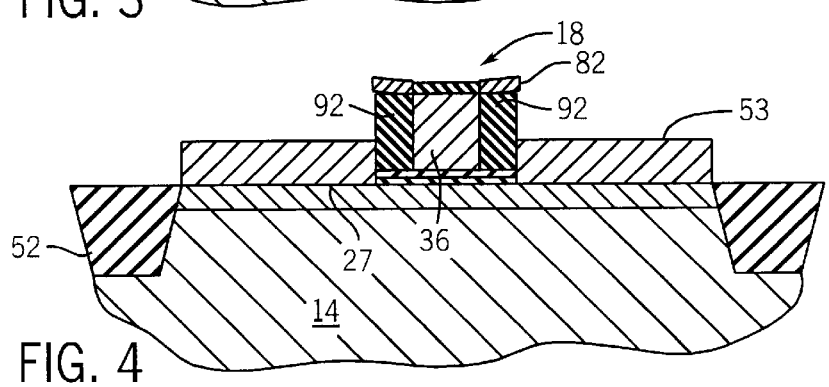
FIG. 4 is a cross-sectional view of the portion of the substrate illustrated in FIG. 3, showing a selective epitaxy step.

In FIG. 4, after structures 92 are formed, portion 10 is subject to a selective semiconductor epitaxy process which provides a layer 53 above top surface 27 of substrate 14. Layer 82 protects conductor 36 from the epitaxy process. Layer 53 is preferably a 300–500 Å thick film of the same material as substrate 14 (e.g., silicon). Structures 92 assist the definition of extensions 23 and 25 as discussed below (FIG. 1).

Figure 5:
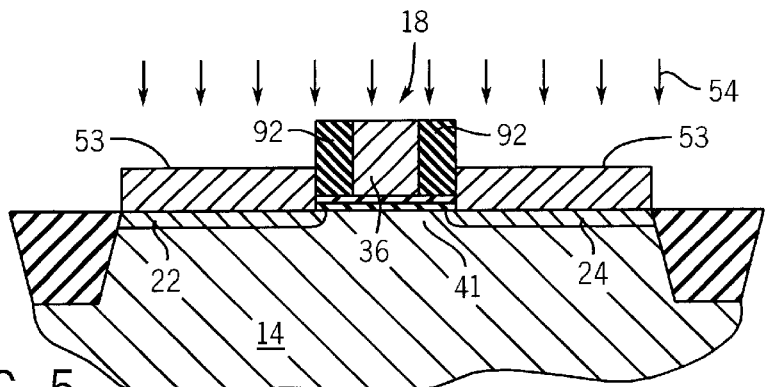
FIG. 5 is a cross-sectional view of the portion of the substrate illustrated in FIG. 4, showing a source/drain dopant implant step.
Figure 6:
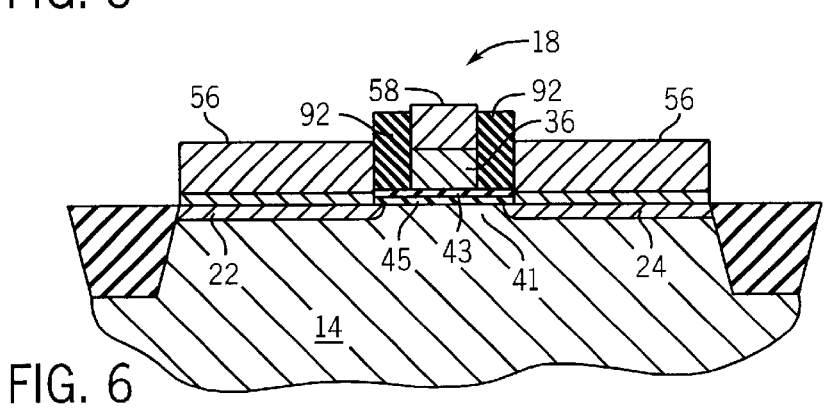
FIG. 6 is a cross-sectional view of the portion of the integrated circuit illustrated in FIG. 1, showing a silicidation step.

In FIG. 5, after layer 53 is provided on top of substrate 14, layer 82 is stripped in a wet chemical etch (e.g., hot phosphoric ($H_3PO_4$) acid etch) or a plasma dry-etch. After layer 82 is removed, portion 10 is subject to an n+ dopant implant (e.g., layer 53 and substrate 14 are doped utilizing non-neutral dopants 54. Preferably, non-neutral dopants, such as, phosphorous (P), Boron (B) arsenic (As), antimony (Sb), indium (In), and gallium (Ga) are implanted into substrate 14 and layer 53 (source region 22 and drain region 24 in FIG. 1). Conductor 36 serves to protect channel region 41 from the dopant implant. In addition, the dopant implant provides dopants to conductor 36. After the dopant implant, a high temperature rapid thermal anneal (RTA) (1050–1100° C.) is utilized to activate dopants in conductor 36 and regions 22 and 24 to ensure low contact series resistance and reduced gate depletion effect. Notably, as extensions 23 and 25 of FIG. 1 have not been formed yet, they are not affected by the high temperature RTA.

Layers 56 and 58 are formed above regions 22 and 24 and conductor 36, respectively. Layers 56 and 58 are preferably formed in a conventional self-aligned silicide process. Layers 56 and 58 can be $CoSi_2$, $TiSi$, $NiSi_2$. Elevated source and drain regions, regions 22 and 24, allow space for layers 56 and 58 to form, thereby decreasing source/drain contact resistance. After layers 56 and 58 are formed, oxide structures 92 are removed by a plasma dry-etch process. Layers 56 and 58 protect drain and source regions 22 and 24 from the dry-etch process. The dry-etch process also removes layers 35 and 43 underneath structures 92, leaving layers 35 and 43 directly underneath gate conductor 36.

Figure 7:
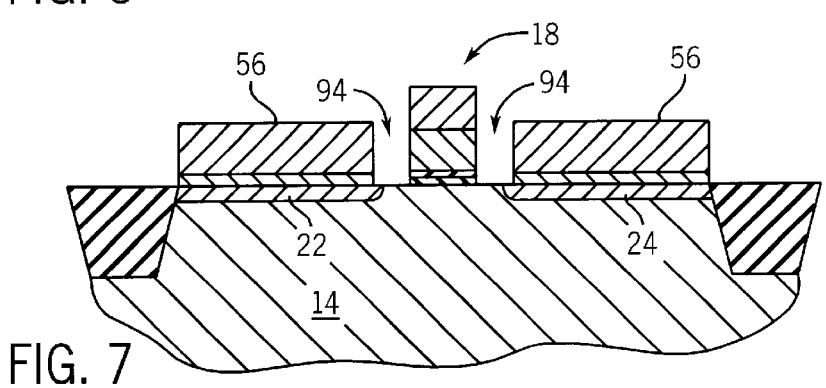
FIG. 7 is a cross-sectional view of the portion of the integrated circuit illustrated in FIG. 1, showing an oxidized structure removal step.

In FIG. 7, openings 94 are formed where structures 92 were removed. Openings 94 are utilized to form source and drain extensions 23 and 25 and pocket implant regions 29 of FIG. 1.

Figure 8:
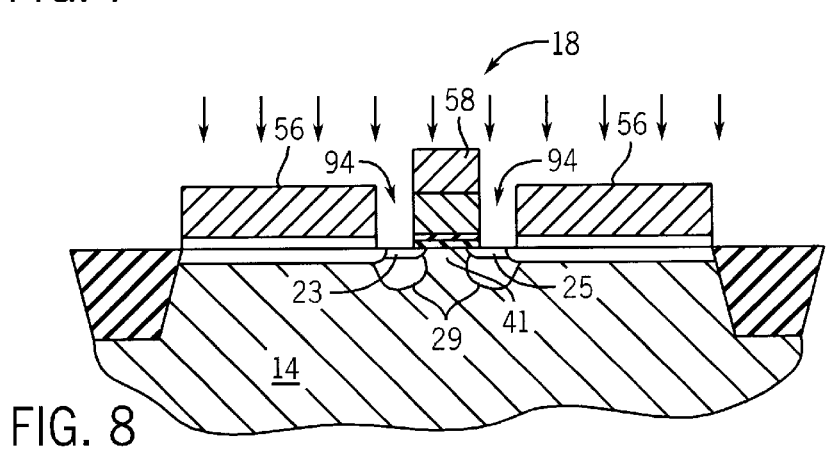
FIG. 8 is a cross-sectional view of the portion of the integrated circuit illustrated in FIG. 1, showing a shallow source and drain extension doping step.

In FIG. 8, a p-type halo or pocket implant is provided through openings 94. The implant forms regions 29. Advantageously, openings 94 allow highly confined and localized pocket regions 29 to be formed.

A dopant implant is also provided through openings 94 (e.g., windows) for extensions 23 and 25. The dopant implant for regions 23 and 25 is preferably a n+ dopant implant. After the dopant implant, a low temperature RTA (e.g., 800–100° C.) is performed to activate dopants in regions 29 and extensions 23 and 25. Unlike a high temperature RTA, the low temperature RTA causes negligible lateral thermal diffusion of dopants.

In FIG. 1, layer 48 is deposited over layers 56 and 58. Layer 48 can be deposited as silicon dioxide in accordance with a tetraethylorthosilicate (TEOS) process. Preferably, layer 48 is 5000–15000 Å thick. After layer 48 is deposited, conventional MOSFET fabrication processes can be utilized to form contacts 62, vias, interconnects, and other devices necessary for portion 10 of the integrated circuit.

The process discussed with reference to FIGS. 1–8 provides advantages over processes which utilize deposited sacrificial spacers. For example, if nitride spacers are used, a liner oxide offset effect can occur. According to conventional structures, an underlying oxide layer (100–200 Å thick) has to be used as an interfacial layer between the silicon material of substrate 14 and the nitride spacer. The underlying oxide layer is usually formed by deposition and also covers the side walls of gate conductor 36. After nitride spacer removal, the liner oxide on the side wall of gate conductor 36 usually remains due to the difficulty of stripping side walls using wet isotropic chemical etch techniques without damaging the thin gate. In addition, plasma anisotropic etches cannot remove the side wall liner oxide. The liner oxide layer on the side walls of gate conductor 36 result in an offset effect for the implant of extensions 23 and 25. For very small transistor dimensions (e.g., gate line less than 80 nanometers), this offset can cause insufficient overlap between gate conductor 36 and ultra-shallow source/drain extension 23 and 25, thereby resulting in large series resistance. Further, utilizing a low-temperature RTA exacerbates this problem because dopant diffusion is minimal at lower temperatures.

Alternatively, a sacrificial oxide spacer can be used. However, such a process results in a triangular spacer formed on a side wall of gate 18. As significant over etch occurs at the top of the triangular shaped spacer, triangular spacers are difficult to remove by dry-etch without damaging the silicon of gate conductor 36. Also, wet chemical etches tend to undercut the thin gate oxide underneath gate conductor 36.

It is understood that while the detailed drawings, specific examples, material types, thicknesses, dimensions, and particular values given provide a preferred exemplary embodiment of the present invention, the preferred exemplary embodiment is for the purpose of illustration only. The method and apparatus of the invention is not limited to the precise details and conditions disclosed. For example, although specific types of capping layers and sacrificial structures are shown, other structures can be utilized. Various changes may be made to the details disclosed without departing from the spirit of the invention which is defined by the following claims.

What is claimed is:

1. A method of manufacturing an integrated circuit, comprising:

providing a gate structure between a source location and a drain location in a semiconductor substrate, the gate structure having a side wall;

oxidizing the sidewall to form an oxide structure;

selectively providing an elevated semiconductor material above a surface of the substrate above the source location and the drain location;

doping the elevated semiconductor material and the substrate at the source location and the drain location to form elevated source and drain regions;

removing the oxide structure to create an opening; and providing a dopant through the opening, thereby forming a source extension or a drain extension.

2. The method of claim 1 further comprising:

providing a pocket implant through the opening before the providing a dopant through the opening step.

3. The method of claim 2 further comprising:

activating the elevated source and drain regions in a high thermal budget process.

4. The method of claim 3, wherein the removing step comprising a dry-etching step.

5. The method of claim 3, further comprising:

activating the source or the drain extension in a low thermal budget process.

6. The method of claim 1 further comprising:

depositing a nitride-oxide-nitride composition over the gate structure before the oxidizing step.

7. The method of claim 6 further comprising:

depositing an oxide-nitride composition over the source location and the drain location before the oxidizing step.

8. The method of claim 1 further comprising:

providing a dielectric material in the opening after the providing a dopant through the opening step.

9. The method of claim 1, wherein the source extension or drain extension has a depth of less than 30 nm from a top surface of the semiconductor substrate.

10. The method of claim 1, wherein the oxide structure includes silicon dioxide.

11. A method of manufacturing an ultra-large scale integrated circuit including a transistor, the method comprising steps of:

forming at least part of a gate structure on a top surface of a semiconductor substrate, the gate structure including side thermally treated to walls cover with sacrificial material;

depositing a semiconductor material over the top surface of the semiconductor substrate;

providing a dopant to the semiconductor substrate and the semiconductor material to form elevated source and drain regions;

removing the sacrificial material to leave a pair of openings; and providing a dopant through the pair of openings, thereby forming shallow source and drain extensions.

12. The method of claim 11 further comprising:

providing a pocket implant through the pair of openings before the first providing a dopant step.

13. The method of claim 11 further comprising:

providing an oxide material in the pair of openings.

14. The method of claim 11, wherein a nitride-oxide-nitride material is provided over the gate structure.

15. The method of claim 14, further comprising:

providing a pocket implant through the openings before the doping through the openings step.

16. The method of claim 15, wherein the polysilicon is doped in the first providing a dopant step.

17. A process for forming a transistor with an elevated source region, an elevated drain region, a shallow source extension and a shallow drain extension, the process comprising:

forming a gate structure on a top surface of a substrate, the gate structure including a polysilicon gate conductor;

growing a material on side walls of the polysilicon gate conductor;

providing a semiconductor material on the top surface of the the elevated regions;

removing the material from the side walls to leave openings; and providing a dopant through the openings to the substrate.

18. The process of claim 17, wherein the semiconductor material includes silicon.

19. The process of claim 18, further comprising:

doping the semiconductor material before the removing step to form the elevated source region and the elevated drain region.

20. The process of claim 18, further comprising:

siliciding the elevated source region and the elevated drain region before the removing step.

* * * * *